United States Patent
Classen

(10) Patent No.: US 12,287,535 B2
(45) Date of Patent: Apr. 29, 2025

(54) CONTACT LENS, METHOD FOR DETECTING A STRUCTURE-BORNE SOUND WITH THE AID OF A CONTACT LENS, METHOD FOR PRODUCING A CONTACT LENS

(71) Applicant: Robert Bosch GmbH, Stuttgart (DE)

(72) Inventor: Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 792 days.

(21) Appl. No.: 17/394,839

(22) Filed: Aug. 5, 2021

(65) Prior Publication Data

US 2022/0057656 A1    Feb. 24, 2022

(30) Foreign Application Priority Data

Aug. 20, 2020 (DE) .................. 102020210593.6

(51) Int. Cl.
G02C 11/00 (2006.01)
B81B 3/00 (2006.01)
B81C 3/00 (2006.01)

(52) U.S. Cl.
CPC ............ G02C 11/10 (2013.01); B81B 3/0021 (2013.01); B81C 3/001 (2013.01); *B81B 2201/0235* (2013.01); *B81C 2203/038* (2013.01)

(58) Field of Classification Search
CPC .... G02B 27/01; G02B 27/0172; G02C 7/046; G02C 7/101; G02C 7/04; G02C 11/10; G02C 11/00; G02C 11/06; B81B 3/0021; B81B 2201/0235; B81C 3/001; B81C 2203/038; G01M 11/02
USPC ................. 351/158, 159.03, 159.02
See application file for complete search history.

(56) References Cited

U.S. PATENT DOCUMENTS

| | | | |
|---|---|---|---|
| 9,363,596 B2 | 6/2016 | Dusan et al. | |
| 2014/0240657 A1* | 8/2014 | Pugh | G02C 7/04 623/6.22 |
| 2014/0303452 A1* | 10/2014 | Ghaffari | H01L 27/14687 601/3 |
| 2016/0150325 A1* | 5/2016 | Oliaei | H04R 3/005 381/111 |
| 2017/0240418 A1* | 8/2017 | Qutub | B81B 7/0041 |
| 2018/0275429 A1* | 9/2018 | Pugh | A61B 3/113 |
| 2019/0230446 A1* | 7/2019 | Schultz | H04R 19/04 |

* cited by examiner

*Primary Examiner* — Travis S Fissel
(74) *Attorney, Agent, or Firm* — NORTON ROSE FULBRIGHT US LLP

(57) ABSTRACT

A contact lens. The contact lens comprises an acceleration sensor for detecting a structure-borne sound produced by a wearer of the contact lens.

14 Claims, 3 Drawing Sheets

CONTACT LENS, METHOD FOR DETECTING A STRUCTURE-BORNE SOUND WITH THE AID OF A CONTACT LENS, METHOD FOR PRODUCING A CONTACT LENS

CROSS REFERENCE

The present application claims the benefit under 35 U.S.C. § 119 of German Patent Application No. DE 102020210593.6 filed on Aug. 20, 2020, which is expressly incorporated herein by reference in its entirety.

FIELD

The present invention is based on a contact lens.

BACKGROUND INFORMATION

For many years, micromechanical inertial sensors for measuring accelerations have been manufactured in mass production for various applications in the automotive and consumer sectors.

Relatively new fields of application for acceleration sensors arise in the field of consumer electronics with the so-called hearables such as earphones/earbuds. Possible applications for acceleration sensors in miniaturized earphones are described in U.S. Pat. No. 9,363,596 B2. A fundamental function of the acceleration sensor is the following: When speaking, the wearer of the earphone produces structure-borne sound or bone-borne sound, which may be detected by a highly sensitive (that is, low-noise) acceleration sensor and is compared with microphone signals. Since the acceleration sensor does not react sensitively to acoustic sound waves from the surroundings, the signal comparison between the acceleration sensor and the microphone makes it possible to filter out interfering noises from the surroundings. A further function may be that the voice control responds via code words only if bone-borne sound signals are also received via the acceleration sensor. This makes it possible to rule out that the codes word was uttered by a third party. In these applications, the acceleration sensor therefore functions as a supplement to the microphone.

Another important area in the field of consumer electronics is that of the so-called smart glasses, that is, intelligent eye glasses, which may comprise an optical projection system and various integrated sensors, inter alia microphones and acceleration sensors for voice control and for so-called tap detection (detection of finger tapping).

Manifold applications for sensors may also arise for smart contact lenses, that is, intelligent contact lenses. A decisive problem in this regard is the fact that in the case of a contact lens, special medical requirements play an important role due to the immediate proximity to the eye.

SUMMARY

It is an objective of the present invention to provide a contact lens, which makes it possible to achieve an improved functionality.

Compared to the related art, the contact lens in accordance with an example embodiment of the present invention may have the advantage that it is possible with the aid of a contact lens to implement an advantageous possibility for voice detection and/or voice transmission. For this purpose, the contact lens comprises an acceleration sensor, which is preferably designed or configured to detect a structure-borne sound produced by a wearer of the contact lens. Using an acceleration sensor in the contact lens thus makes it possible to detect a structure-borne sound produced by the human voice and thereby to implement a microphone substitute in a contact lens.

From an application perspective, a microphone function in contact lenses for voice recognition and voice control of electronic devices with which the contact lens communicates (for example, smart phones, smart home devices, wearables) is highly desirable. When integrating electronic components in contact lenses, however, a decisive aspect from a medical point of view is that the electronic components should be completely surrounded by a protective layer, that is, that they have no direct contact with the eye, neither with the epithelium nor with the eye lid. The requirement of a full integration of the components into the interior of the contact lens, however, sets very narrow limits for the use of media sensors in contact lenses or even prevents this use. In particular, the use of customary microphones, that is, acoustic sensors, in contact lenses is nearly impossible since the microphone would have to have a direct access to the surrounding air in order to have a practical function. This stands in contradiction, however, to the complete embedding of the component into the contact lens.

According to the present invention, these problems (of acoustic sensors or customary microphones) may be overcome in that an acceleration sensor for detecting a structure-borne sound produced by a wearer of the contact lens may be configured as part of the contact lens. The acceleration sensor makes it possible, according to the present invention, to detect the structure-borne sound of the human voice so that the acceleration sensor is advantageously able to take on a microphone function. Particularly advantageously, interfering noises from the surroundings are effectively suppressed in the process, since the acceleration sensor is not sensitive to air-borne sound. It is thus possible to ascertain a clear voice signal from the data of the acceleration sensor even in very loud surroundings.

The fact that it is possible according to an example embodiment of the present invention that the acceleration sensor is advantageously designed to detect a structure-borne sound yields also advantages in particular with regard to the use of an acceleration sensor in a contact lens, which is intended and designed merely and exclusively for detecting low-frequency accelerations (in the range of a few Hz, for example below 20 Hz), for example for measuring a relative position of the eyes and for distinguishing between slight squinting (in close-range focus, for example when reading) and a parallel orientation of the eyes (distance vision).

Advantageous developments and refinements of the present invention may be gathered from the description herein and the figures.

According to one specific embodiment of the present invention, the acceleration sensor is situated in the interior of the contact lens, in particular in such a way that the acceleration sensor is completely enclosed by one or multiple layers of the contact lens, making it advantageously possible to integrate the acceleration sensor into the contact lens in a particularly well-tolerated manner that is advantageous from a medical point of view. The acceleration sensor in this case preferably has no contact with the ambient air. The acceleration sensor may have in particular a hermetically sealed package and may thus be integrated into the contact lens with the aid of a molding method for example, the sensor preferably being completely enclosed by the molded protective layer.

According to one specific embodiment of the present invention, the acceleration sensor has a total thickness of less than 300 μm thus allowing for a particularly advantageous integration into a contact lens due to the small total thickness of the sensor.

According to one specific embodiment of the present invention, the acceleration sensor is situated in a cavity formed with the aid of a MEMS chip (microelectromechanical system chip) and/or an ASIC chip (application-specific integrated circuit chip), the cavity being hermetically sealed in particular with the aid of a bonding frame, thus making it possible to situate the acceleration sensor in a hermetically sealed cavity and thus to insulate it from the surroundings.

According to one specific embodiment of the present invention, the MEMS chip and/or the ASIC chip has at least one via, in particular a through silicon via (TSV), the acceleration sensor preferably being developed as a chip scale package, thus advantageously allowing for an electrical connection to the acceleration sensor, while nevertheless achieving a compact and space-saving embodiment. For the application as a structure-borne sound sensor in a contact lens, the acceleration sensor preferably has a sufficiently wide-band, low-noise, compact and power-saving design. The compactness may be achieved particularly advantageously by implementing the sensor as an extremely small-construction chip scale package, in which the MEMS and ASIC chips are vertically integrated by a metallic wafer bonding method and in which the sensor may be ground back to very small overall heights. Especially for a capacitive acceleration sensor, this system additionally offers advantages with regard to electronic noise, since, due to the vertical integration, the electrical signal path between the MEMS and the ASIC has comparatively low parasitic capacitances due to particularly short conductor track lengths, which makes it possible to achieve a particularly high signal-to-noise ratio.

According to one specific embodiment of the present invention, the acceleration sensor for detecting a structure-borne sound has a 3 dB bandwidth of at least 2 kHz, preferably at least 2.5 kHz, thus particularly advantageously making it possible to detect the structure-borne sound signals produced by the human voice for different persons.

According to one specific embodiment of the present invention, the acceleration sensor is designed to output a structure-borne sound signal as a function of the structure-borne sound detected by the acceleration sensor, a low-pass filter and/or a band-pass filter being provided for outputting and/or further processing of the structure-borne sound signal, the deep-pass filter preferably having a 3 dB frequency limit between and including 2 kHz and 2.5 kHz and/or the band-pass filter preferably has a lower 3 dB frequency limit of less than or equal to 60 Hz and an upper 3 dB frequency limit of at least 2 kHz, particularly preferably an upper frequency limit of at least 2.5 kHz, particularly advantageously making it possible to achieve a reliable detection for all frequencies producible by the human voice. The output structure-borne sound signal is preferably an electrical signal. Particularly below the upper 3 dB frequency limit, the acceleration sensor has a maximally flat transfer function, as is also required for common microphones, so as to be able to reproduce a sound of the voice that is as natural and unaltered as possible.

According to one specific embodiment of the present invention, the acceleration sensor is designed, in addition to the detection of the structure-borne sound produced by the wearer, to detect low-frequency accelerations, in particular below 60 Hz, preferably below 20 Hz, the acceleration sensor being designed to output an acceleration signal as a function of the detected low-frequency accelerations, a low-pass filter preferably having a 3 dB frequency limit of less than or equal to 60 Hz, particularly preferably less than or equal to 20 Hz being provided for outputting and/or further processing of the acceleration signal, thus making it possible that the acceleration sensor is able to fulfill further functions aside from the structure-borne sound detection. The acceleration sensor may be designed for example to detect low-frequency accelerations such as an eyelid movement. A typical eyelid movement has a duration of 100 to 200 ms. In order to detect this reliably, the low-pass filter has a frequency limit of less than or equal to 60 Hz, for example. For a tilting or shaking of the head, that is, for movements having frequencies in the order of magnitude of a few Hertz, a frequency limit of 20 Hz would be well suited, for example. In addition to its function as a structure-borne sound sensor, the sensor is thus also able to take on functions of an acceleration sensor, which concern only low-frequency signal components, for example a tilting of the head, eye blinking, changing orientation of the eyes, etc. The acceleration signal output by the acceleration sensor as a function of the detected low-frequency accelerations is preferably an electrical signal.

According to one specific embodiment of the present invention, the contact lens comprises an energy supply device for supplying the acceleration sensor, and/or the contact lens comprises a communication circuit having a signal transmission interface and/or a signal receiving interface, the communication circuit being developed as part of the ASIC chip or being a component developed separately from the ASIC chip, thus advantageously making it possible for the communication circuit to communicate with external devices such as smart phones, wearables, IoT (Internet of Things) devices via the signal transmission interface, in particular wireless interface(s) (for example Bluetooth). It is thus possible to transmit the signals of the acceleration sensor from the communication circuit (for example a Bluetooth transmitter) to connected signal receivers in the surroundings. With the aid of the communication circuit, is furthermore possible to receive signals from external devices.

It is preferably possible that circuit means (i.e., a circuit device), for example a microcontroller, are integrated in the contact lens, the circuit means being configured to read out the structure-borne sound signal and/or the acceleration signal of the acceleration sensor. The circuit means may be integrated for example in the acceleration sensor, in the communication circuit and/or as a separate component in the contact lens.

A further subject matter of the present invention is a method for detecting a structure-borne sound with the aid of a contact lens according to a specific embodiment of the present invention, the acceleration sensor detecting the structure-borne sound produced by the wearer of the contact lens.

A further subject matter of the present invention is a method for producing a contact lens according to a specific embodiment of the present invention, the acceleration sensor being integrated into the contact lens in a step of producing the contact lens.

According to one specific embodiment of the present invention, in particular of the method for producing a contact lens, the acceleration sensor is produced with the aid of a bonding step, a MEMS chip and an ASIC chip being connected to one another in the bonding step, preferably with the aid of eutectic bonding, the bonding step being performed in particular before the acceleration sensor is integrated into the contact lens in the step of producing the contact lens, thus making it possible to produce a particularly compact and space-saving sensor, which may be advantageously integrated into a contact lens.

According to one specific embodiment of the present invention, it is possible that the acceleration sensor is produced via a vertical integration method, in particular by a metallic wafer bonding method between a MEMS and a CMOS or ASIC wafer, preferably via an eutectic bonding method, particularly preferably via Al—Ge bonding. It is possible that the acceleration sensor takes the form of a chip scale package having through silicon vias. It is possible that the through silicon vias are passed through the CMOS wafer and/or through the MEMS wafer.

According to one specific embodiment of the present invention, it is possible that the acceleration sensor is thinned to small thicknesses, in particular to a total stack thickness of the MEMS and ASIC wafers of less than or equal to 300 µm. This makes a particularly advantageous integration into the contact lens possible.

It is preferably possible that the acceleration sensor has planar contact pads and may therefore be mounted with little standoff (preferably 10 to 60 µm).

It is possible that the acceleration sensor is sensitive in one direction (x or y or z), in two directions (xz or xy) or in three directions (xyz). In a multi-channel sensor, it is possible in this connection that at least one common seismic mass is used, which is deflectable in at least two directions.

The advantages and embodiments that were described above in connection with the contact lens of the present invention or in connection with a specific embodiment of the contact lens of the present invention may be applied to the method for detecting a structure-borne sound with the aid of a contact lens and the method for producing a contact lens.

Exemplary embodiments of the present invention are illustrated in the figures and explained in greater detail in the following description.

DETAILED DESCRIPTION OF EXAMPLE EMBODIMENTS

In the various figures, identical parts are always provided with the same reference symbols and are therefore normally labeled or mentioned only once.

Figure 1B:
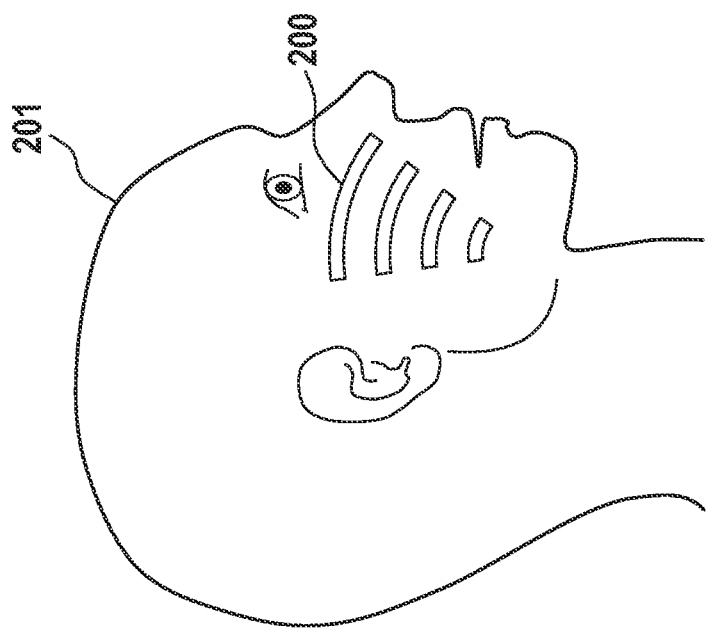
FIGS. 1a and 1b show schematic illustrations of a human head.
Figure 1A:
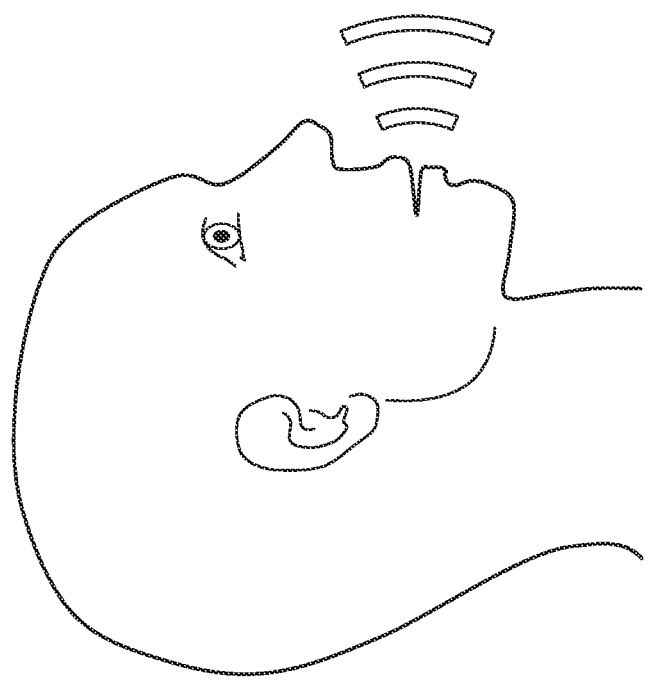

FIG. 1a schematically shows a human head, in which acoustic sound waves are produced while speaking. As shown schematically in FIG. 1b, a structure-borne sound 200 (or structure-borne sound waves 200) arise in the head 201 when speaking, which reaches, inter alia, also the region around the human eye.

Figure 2:
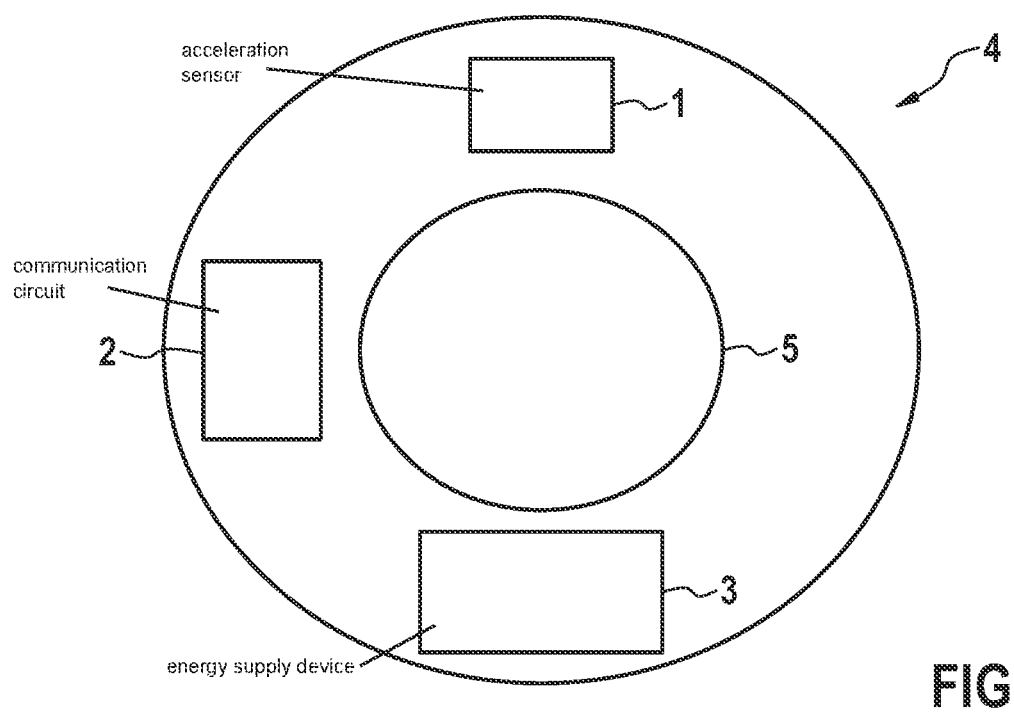
FIG. 2 shows a schematic illustration of a contact lens according to a specific embodiment of the present invention.

FIG. 2 is a schematic illustration of a contact lens 4 according to one specific embodiment of the present invention in a top view. Multiple electronic components are arranged around the central lens area 5 in the outer area of contact lens 4, that is, outside of the visual range, in particular an acceleration sensor 1 for structure-borne sound detection, a communication circuit 2 (for example a communications chip) for transmitting/receiving data, which may be connected, in particular wirelessly, to devices outside of contact lens 4, as well as an energy supply device 3, for example a miniature battery, which may possibly also be rechargeable. Between all of the electronic components 1, 2, 3, electrical connections are preferably developed, which are not shown in FIG. 2 for the sake of clarity. Energy supply device 3 supplies acceleration sensor 1 and communications circuit 2 with voltage and current. Signals between acceleration sensor 1 and communications circuit 2 may be transmitted via a bidirectional data protocol (for example $I^2C$, $I^3C$, SPI). A signal processing of the raw data of acceleration sensor 1 may be performed in acceleration sensor 1 itself and/or in communications circuit 2. For this purpose, acceleration sensor 1 and/or communications circuit 2 may contain a microcontroller for signal processing. Via one or multiple wireless interfaces (for example Bluetooth), communications circuit 2 communicates with external devices such as smart phones, wearables and/or IoT (Internet of Things) devices, for example. As an alternative to the represented embodiment, it is also possible that communications circuit 2 is integrated in acceleration sensor 1. This presents special challenges for miniaturization, however, for due to the ring-shaped geometry (viewed from the top) and the outwardly increasing flatness (in the cross section) of the contact lens geometry, it is problematic to integrate chips into the contact lens whose edge length in the radial direction exceeds 1 mm, whose edge length in the tangential direction exceeds 2 mm and whose overall height exceeds a few 100 µm.

Acceleration sensor 1 has at least the function of a structure-borne sound sensor, that is, it is not merely an inertial sensor, which exclusively aims for low-frequency signals (slow movements of the eyes or head). In order for this to function reliably with all frequencies that can be produced by the human voice, acceleration sensor 1 preferably has a bandwidth $f_{3dB}$ of at least 2 kHz, preferably 2.5 kHz, and for frequencies below this frequency limit it has a maximally flat transfer function so as to be able to reproduce a sound of the voice that is as natural and unaltered as possible.

Figure 3:
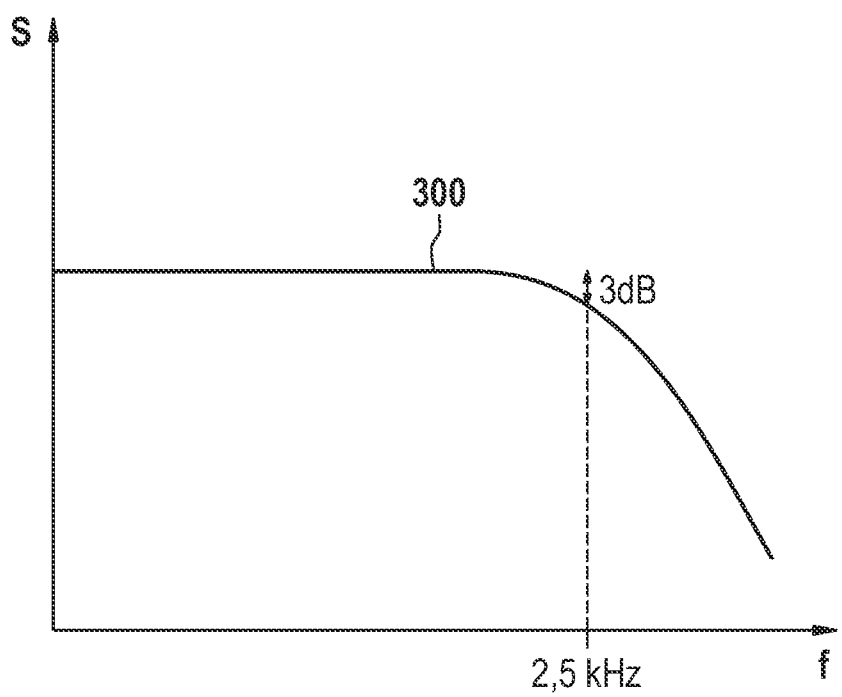
FIG. 3 shows schematically a transfer function of an acceleration sensor of a contact lens according to an exemplary embodiment of the present invention.

FIG. 3 schematically shows a corresponding transfer function 300 (that is, the level of the electrical output signal S as a function of the voice frequency f) of an acceleration sensor 1 of a contact lens 4 according to an exemplary embodiment of the present invention. The 3 dB frequency limit is in this case 2.5 kHz. Such a flat transfer function of acceleration sensor 1 may be ensured for example via a mechanical transfer function of the micromechanical sensor element that is flat within the bandwidth combined with a simple low-pass filter in the evaluation ASIC. For such a form of implementation, acceleration sensor 1 may have for example a sufficiently high resonant frequency ($f_{res} \gg f_{3dB}$) and/or may be damped relatively highly (Lehr's damping factor~0.7) in that the sensor cavity of acceleration sensor 1 is filled with a gas of suitable viscosity.

Alternatively, such a flat total transfer function of acceleration sensor 1 may also be achieved via a resonant frequency of the sensor, which is for example only a factor 2 to 3 above the frequency limit $f_{3dB}$, combined with a markedly sub-critical damping (for example D~0.1). In this case, however, the ASIC must compensate again for the frequency sensitivity of the mechanical transfer function via suitable electronic filters. This configuration is particularly favorable with regard to the achievable noise level, since otherwise either the electronic noise in the case of an excessively high resonant frequency or the Brownian noise in the case of excessively high damping (due to the statistical movement of the seismic mass of the sensor as a result of molecular collisions) may become too great. Both noise terms, electronic and Brownian noise, must be added quadratically for calculating the total noise power density. As soon as one of the terms becomes to great, the total noise is therefore too high.

The acceleration sensor 1 may be designed as a one-axis, two-axis or three-axis acceleration sensor, that is, it may be sensitive in one, two or three spatial directions. When using multi-axis sensors, the signals measured in the different axes may be added quadratically in order to generate an effective signal analogous to a microphone output signal. This signal processing may be performed for example either in the microcontroller of acceleration sensor 1 or of communications circuit 2 (or of communications chip 2).

For implementing configurations according to specific embodiments of the present invention in a contact lens 4, the miniaturization of the components 1, 2, 3 to be integrated in contact lens 4 is of great importance. In conventional acceleration sensors 1, the MEMS chip and the ASIC chip are frequently packaged in molded housings. An LGA2×2 molded housing, that is, a housing having lateral dimensions of 2×2 mm² and overall heights between 0.6 and 1.0 mm is frequently used for this purpose. Such standard sensors, however, are clearly too large for integration in an intelligent contact lens 4.

Figure 4:
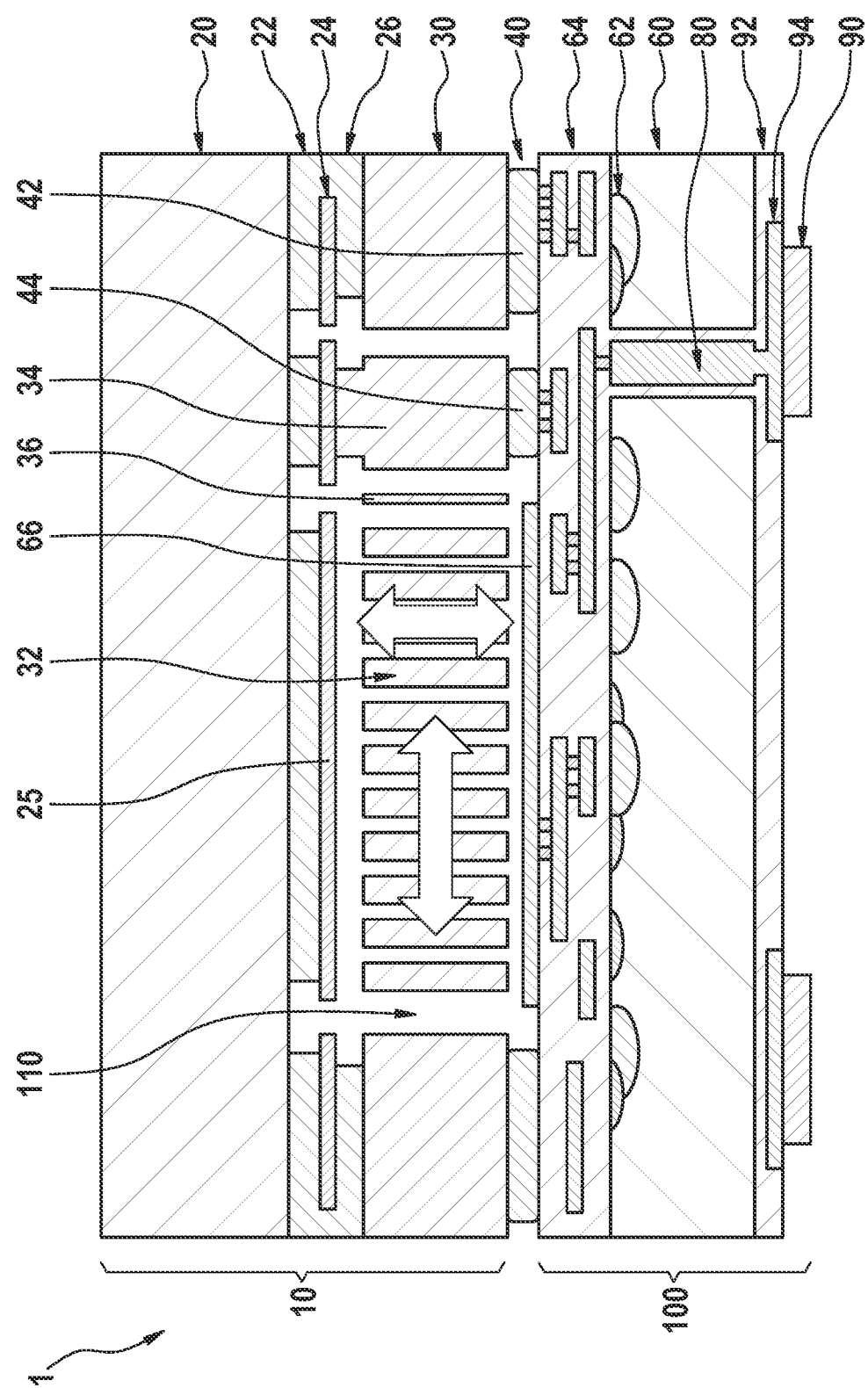
FIG. 4 shows a schematic illustration of an acceleration sensor for a contact lens according to a specific embodiment of the present invention.

According to one specific embodiment of the present invention, it is therefore particularly advantageously possible to omit an outer packaging of the MEMS chip and the ASIC chip. FIG. 4 shows a schematic illustration of an acceleration sensor 1 for a contact lens 4 according to a specific embodiment of the present invention.

Acceleration sensor 1 is formed by a wafer stack, comprising a MEMS wafer 10 and a CMOS or ASIC wafer 100. The MEMS wafer 10 is preferably produced using surface-micromechanical methods. A first insulating layer 22, preferably as an oxide layer, and a first functional layer 24, preferably as a polycrystalline silicon layer, are deposited and patterned on silicon substrate 20. A first fixed evaluation electrode 25 is optionally situated in first functional layer 24. Functional layer 24 is moreover used for the electrical redistribution within the MEMS chip. A second insulating layer 26, again preferably as an oxide layer, and above it at least one second, thicker functional layer 30, preferably of polycrystalline silicon, are situated above first functional layer 24. Functional layer 30 is patterned using a trench process (for example Deep Reactive Ion Etching, DRIE) in order to produce suspensions 34, a movable sensor mass 32, at least one spring 36 and, if indicated, fixed counter electrodes for an acceleration sensor 1 that is laterally movable, that is, parallel to plane of the chip.

CMOS wafer 100 comprises a silicon substrate 60, doping areas 62 for producing transistor circuits and the CMOS back end stack 64 made up of insulator layers and metal layers, which can be connected to one another by way of metallic vias. The MEMS and CMOS wafers 10, 100 are connected to each other mechanically and electrically using a metallic bonding method. Bonding layer 40 preferably may be produced using an eutectic bonding method, for example with aluminum on one wafer and germanium on the other wafer. On the one hand, a circumferential bonding frame 42 may be situated in bonding layer 40, which encloses cavity 110 formed by the mutually facing sides of the MEMS and ASIC wafers 10, 100. On the other hand, electrical contacts 44 between the MEMS and ASIC wafers 10, 100 may also be produced via the metallic bonding layer. Optionally, a further fixed evaluation electrode 66 for detecting movements perpendicular to the chip plane is situated in the uppermost metallization layer of the ASIC. The arrows in FIG. 4 indicate that the sensor may be movable laterally and/or vertically, that is, it can detect accelerations in the corresponding directions. In particular, there may be a single movable sensor mass, which is deflectable in multiple directions (xy, xz oder xyz) on the basis of suitable spring geometries. Such a configuration is particularly advantageous for the application since Brownian noise is reduced due to the in this case particularly great common sensor mass (Brownian noise scales with 1/root(mass)).

In the exemplary embodiment of FIG. 4, furthermore, through silicon vias (TSVs) 80 and on the back side of the ASIC a redistribution layer (RDL) 94, and external pads 90 for contacting the sensor are situated in CMOS wafer 100 for the input/output signals of the ASIC. Redistribution layer 94 is electrically separated from ASIC substrate 60 by one or multiple passivation layers 92.

For the integration into contact lens 4, it is advantageous that the overall height of acceleration sensor 1 is very small. In a particularly advantageous manner, the wafer stack made up of MEMS wafer 10 and ASIC wafer 100 is highly thinned by grinding and CMP processes in order to produce overall heights in the order of magnitude of 150 to 400 μm. For this purpose, both wafers 10, 100 are preferably highly back-thinned. ASIC wafer 100 is preferably ground back to a lesser thickness than MEMS wafer 10 in order to render the TSV process particularly simple and cost-effective.

According to alternative specific embodiments of the present invention, other designs of an acceleration sensor than the one illustrated in FIG. 4 are possible as well, for example different wafer stacks, different external contacting, different MEMS process, etc.

According to the present invention, acceleration sensor 1 preferably may be used as a structure-borne sound sensor in the frequency range of approximately 60-2500 Hz and thus as a microphone substitute. Furthermore, it is also possible, however, to measure low-frequency signals of the acceleration sensor 1 and thus to implement, in addition to its basic function of voice detection/voice transmission, further functions (for example the detection of eye blinking, orientation of the eyes, inclination of the head), and thus to make possible further applications for the intelligent contact lens via an acceleration sensor 1.

What is claimed is:

1. A contact lens, comprising:
an acceleration sensor configured to detect a structure-borne sound produced by a wearer of the contact lens, wherein the acceleration sensor is configured to output a structure-borne sound signal as a function of the structure-borne sound detected by the acceleration sensor, a low-pass filter and/or a band-pass filter being provided for outputting and/or further processing of the structure-borne sound signal, the band-pass filter having a 3 dB frequency limit between and including 2 kHz and 2.5 kHz and/or the band-pass filter having a lower 3 dB frequency limit of less than or equal to 60 Hz and an upper 3 dB frequency limit of great than or equal to 2 kHz.

2. The contact lens as recited in claim 1, wherein the acceleration sensor is situated in an interior of the contact lens in such a way that the acceleration sensor is completely enclosed by one or multiple layers of the contact lens.

3. The contact lens as recited in claim 1, wherein the acceleration sensor has a total thickness of less than 300 μm.

4. The contact lens as recited in claim 1, wherein the acceleration sensor is situated in a cavity formed at least partially by at least one side of a MEMS chip and/or an ASIC chip, the cavity being hermetically sealed with the aid of a bonding frame.

5. The contact lens as recited in claim 4, wherein the MEMS chip and/or the ASIC chip has at least one via, the at least one via being a through silicon via, the acceleration sensor is in the form of a chip scale package.

6. The contact lens as recited in claim 1, wherein the acceleration sensor has a 3 dB bandwidth of at least 2 kHz for detecting the structure-borne sound.

7. The contact lens are cited in claim 1, wherein the acceleration sensor has a 3 dB bandwidth of at least 2.5 kHz for detecting the structure-borne sound.

8. A contact lens, comprising:
an acceleration sensor configured to detect a structure-borne sound produced by a wearer of the contact lens,
wherein the acceleration sensor is further configured to detect low-frequency accelerations, the low frequency accelerations being below 60 Hz, the acceleration sensor being configured to output an acceleration signal as a function of the detected low-frequency accelerations, a low-pass filter having a 3 dB frequency limit of less than or equal to 60 Hz, being provided for outputting and/or further processing of the acceleration signal.

9. A contact lens, comprising:
an acceleration sensor configured to detect a structure-borne sound produced by a wearer of the contact lens,
wherein the acceleration sensor is further configured to detect low-frequency accelerations, the low frequency accelerations being below 20 Hz, the acceleration sensor being configured to output an acceleration signal as a function of the detected low-frequency accelerations, a low-pass filter having a 3 dB frequency limit of less than or equal to 20 Hz, being provided for outputting and/or further processing of the acceleration signal.

10. The contact lens as recited in claim 4, wherein: (i) the contact lens includes an energy supply device configured to supply the acceleration sensor, and/or (ii) the contact lens includes a communications circuit having a signal transmission interface and/or a signal reception interface, the communications circuit being part of the ASIC chip or being a component developed separately from the ASIC chip.

11. A method for detecting a structure-borne sound using a contact lens, the contact lens including an acceleration sensor configured to detect a structure-borne sound produced by a wearer of the contact lens, the method comprising:
detecting, by the acceleration sensor, the structure-borne sound produced by the wearer of the contact lens,
wherein the acceleration sensor is configured to output a structure-borne sound signal as a function of the structure-borne sound detected by the acceleration sensor, a low-pass filter and/or a band-pass filter being provided for outputting and/or further processing of the structure-borne sound signal, the band-pass filter having a 3 dB frequency limit between and including 2 kHz and 2.5 kHz and/or the band-pass filter having a lower 3 dB frequency limit of less than or equal to 60 Hz and an upper 3 dB frequency limit of great than or equal to 2 kHz.

12. A method for producing a contact lens, the method comprising:
integrating an acceleration sensor into a contact lens,
wherein the acceleration sensor is configured to output a structure-borne sound signal as a function of a structure-borne sound detected by the acceleration sensor, a low-pass filter and/or a band-pass filter being provided for outputting and/or further processing of the structure-borne sound signal, the band-pass filter having a 3 dB frequency limit between and including 2 kHz and 2.5 kHz and/or the band-pass filter having a lower 3 dB frequency limit of less than or equal to 60 Hz and an upper 3 dB frequency limit of great than or equal to 2 kHz.

13. The method as recited in claim 12, wherein the acceleration sensor is produced with the aid of a bonding step, a MEMS chip and an ASIC chip being connected to each other in the bonding step, the bonding step being in performed before the acceleration sensor is integrated into the contact lens.

14. The method as recited in claim 13, wherein the MEMS chip and the ASIC chip are connected to each other using eutectic bonding.

* * * * *